(12) United States Patent
Chen et al.

(10) Patent No.: US 6,498,059 B2
(45) Date of Patent: Dec. 24, 2002

(54) METHOD FOR FABRICATING THIN FILM TRANSISTOR

(75) Inventors: Chih-Chang Chen, Taipei (TW); Jerry Ji-Ho Kung, Taipei (TW)

(73) Assignee: Hannstar Display Corp. (TW)

( * ) Notice: Subject to any disclaimer, the term of this patent is extended or adjusted under 35 U.S.C. 154(b) by 0 days.

(21) Appl. No.: 09/815,212

(22) Filed: Mar. 22, 2001

(65) Prior Publication Data

US 2001/0044172 A1 Nov. 22, 2001

(30) Foreign Application Priority Data

May 19, 2000 (TW) .................................. 089109725

(51) Int. Cl.$^7$ .......................... H01L 21/00; H01L 21/84
(52) U.S. Cl. ...................... 438/151; 438/153; 438/154
(58) Field of Search ............................. 438/149–166

(56) References Cited

U.S. PATENT DOCUMENTS

| | | | | | |
|---|---|---|---|---|---|
| 5,510,278 A | * | 4/1996 | Nguyen et al. | ............ | 437/40 |
| 5,943,559 A | * | 8/1999 | Maeda | ............ | 438/149 |
| 5,998,229 A | * | 12/1999 | Lyu et al. | ............ | 438/30 |
| 6,025,216 A | * | 2/2000 | Ha | ............ | 438/161 |
| 6,046,479 A | * | 4/2000 | Young et al. | ............ | 257/330 |
| 6,057,181 A | * | 5/2000 | Kim | ............ | 438/158 |
| 6,362,028 B1 | * | 3/2002 | Chen et al. | ............ | 438/149 |

* cited by examiner

Primary Examiner—John F. Niebling
Assistant Examiner—Viktor Simkovic
(74) Attorney, Agent, or Firm—Alston & Bird LLP

(57) ABSTRACT

A method for fabricating a thin film transistor (TFT) is provided. The method includes steps of a) providing an insulation substrate, b) forming a conductive layer on the insulation substrate, c) defining the conductive layer as a gate conducting structure by a first photolithography and etch process, d) forming a gate insulation layer, a channel layer, a junction layer, a source/drain layer and a data line layer in sequence, and etching the data line layer, the source/drain layer and the junction layer by a second photolithography and etch process to form a source/drain structure and a data line structure, and e) heat-treating the junction layer to reduce resistance between the source/drain structure and the channel layer.

20 Claims, 4 Drawing Sheets

METHOD FOR FABRICATING THIN FILM TRANSISTOR

FIELD OF THE INVENTION

The present invention provides a method for fabricating a thin film transistor, and more particularly to a method for fabricating a thin film transistor-liquid crystal display (TFT-LCD).

BACKGROUND OF THE INVENTION

Please refer to FIGS. 1(a) to (e). For fabricating a typical TFT-LCD, five photolithography and etch processes are required. A gate conducting layer is formed on an insulating substrate 10 and a first photolithography and etch process is performed to form a gate conducting structure 11, as shown in FIG. 1(a). A gate insulator layer 12, a channel layer 13, and an etched-stop layer are formed in sequence, and the etched-stop layer is etched by a second photolithography and etch process to form an etched-stop structure 14, as shown in FIG. 1(b). In addition, a source/drain layer and a data line layer are formed in sequence, and a third photolithography and etch process is performed to form a source/drain structure 15 and a data line structure 16, as shown in FIG. 1(c). A passivation 17 is formed and a fourth photolithography and etch process is performed to define a contact window structure 18, as shown in FIG. 1(d). Finally, a transparent electrode layer is formed and a fifth photolithography and etch process is performed to form a transparent pixel electrode area 19, as shown in FIG. 1(e).

However, there is a problem that the five photolithography and etch processes are complex, time consuming and costly. Furthermore, damage due to the photolithography and etch processes may occur, thereby deteriorating reliability and yield of the fabricating process.

Therefore, the present invention provides a method for fabricating a TFT-LCD to overcome the foresaid drawbacks.

SUMMARY OF THE INVENTION

There is an object of the present invention to provide a method for fabricating a thin film transistor (TFT).

In accordance with the present invention, the method includes steps of a) providing an insulation substrate, b) forming a conductive layer on the insulation substrate, c) defining the conductive layer as a gate conducting structure by a first photolithography and etch process, d) forming a gate insulation layer, a channel layer, a junction layer, a source/drain layer and a data line layer in sequence, and etching the data line layer, the source/drain layer and the junction layer by a second photolithography and etch process to form a source/drain structure and a data line structure, and e) heat-treating the junction layer to reduce resistance between the source/drain structure and the channel layer.

Preferably, the channel layer is formed by intrinsic semiconductor, and the source/drain layer is made of highly doped semiconductor. The intrinsic semiconductor is intrinsic amorphous silicon, and the highly doped semiconductor is highly doped amorphous silicon.

Preferably, the material of the junction layer is one of a highly doped germanium layer and a highly doped silicon-germanium layer.

In addition, the junction layer has a thickness ranged from about 100 to 200 angstrom. The step of heat-treating the junction layer is an annealing process performed at 350 to 550° C. for 2 to 4 hours.

In addition, the junction layer is a silicidable metal layer. Preferably, the silicidable metal is one selected from a group consisting of chromium, nickel and platinum. The silicidable metal layer has a thickness ranged from about 50 to 100 angstrom.

Preferably, the step of heat-treating said junction layer is an annealing process performed at 230° C. for 1 hour.

There is another object of the present invention to provide a method for fabricating a thin film transistor-liquid crystal display (TFT-LCD)

In accordance with the present invention, the method includes steps of a) providing an insulation substrate, b) forming a conductive layer on the insulation substrate, c) defining the conductive layer as a gate conducting structure by a first photolithography and etch process, d) forming a gate insulation layer, a channel layer, a junction layer, a source/drain layer and a data line layer in sequence, and etching the data line layer, the source/drain layer and the junction layer by a second photolithography and etch process to form a source/drain structure and a data line structure, e) forming a passivation and defining a contact window on the passivation by a third photolithography and etch process, f) forming a transparent electrode layer and defining a transparent pixel electrode region by a fourth photolithography and etch process, and g) heat-treating the junction layer to reduce resistance between the source/drain structure and the channel layer.

Preferably, the channel layer is formed by intrinsic semiconductor, and the source/drain layer is formed by highly doped semiconductor. The intrinsic semiconductor is intrinsic amorphous silicon, and the highly doped semiconductor is highly doped amorphous silicon.

Preferably, the material of the junction layer is one of a highly doped germanium layer and a highly doped silicon-germanium layer.

Preferably, the junction layer has a thickness ranged from about 100 to 200 angstrom. The step of heat-treating is a first annealing process performed at 230° C. for 1 hour. The junction layer is a silicidable metal layer having a thickness ranged from about 50 to 100 angstrom.

In accordance with the present invention, the silicidable metal is one selected from a group consisting of chromium, nickel and platinum.

In addition, the transparent pixel electrode is made of indium tin oxide. Furthermore, the first annealing process is combined with a second annealing process performed on the indium tin oxide.

The present invention may best be understood through the following descriptions with reference to the accompanying drawings, in which:

DETAILED DESCRIPTION OF THE PREFERRED EMBODIMENTS

Figure 1A:
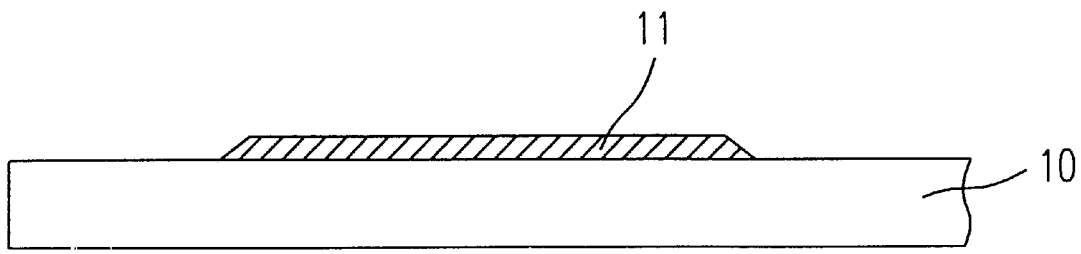
FIGS. 1(a) to (e) are schematic views showing a method for fabricating a TFT-LCD according to a prior art.
Figure 1B:
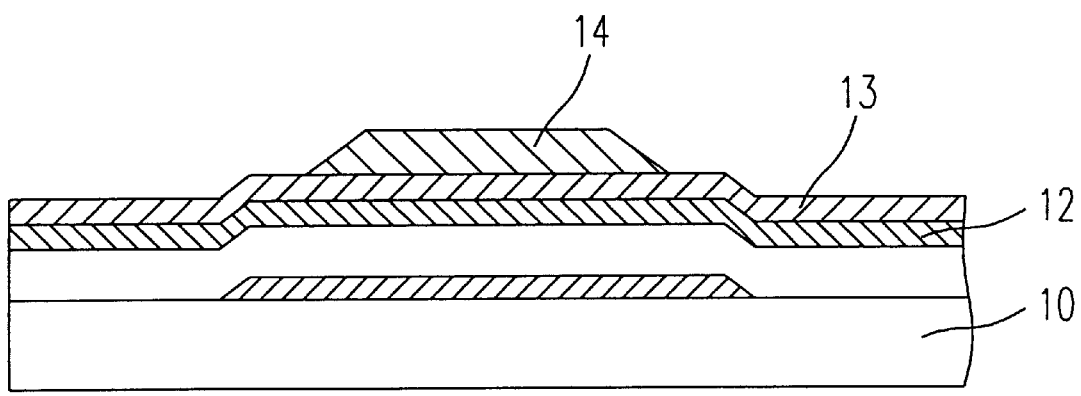
Figure 1C:
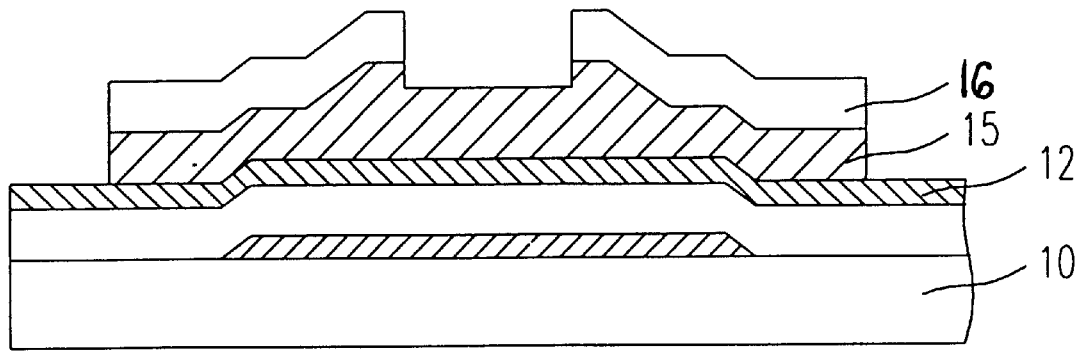
Figure 1D:
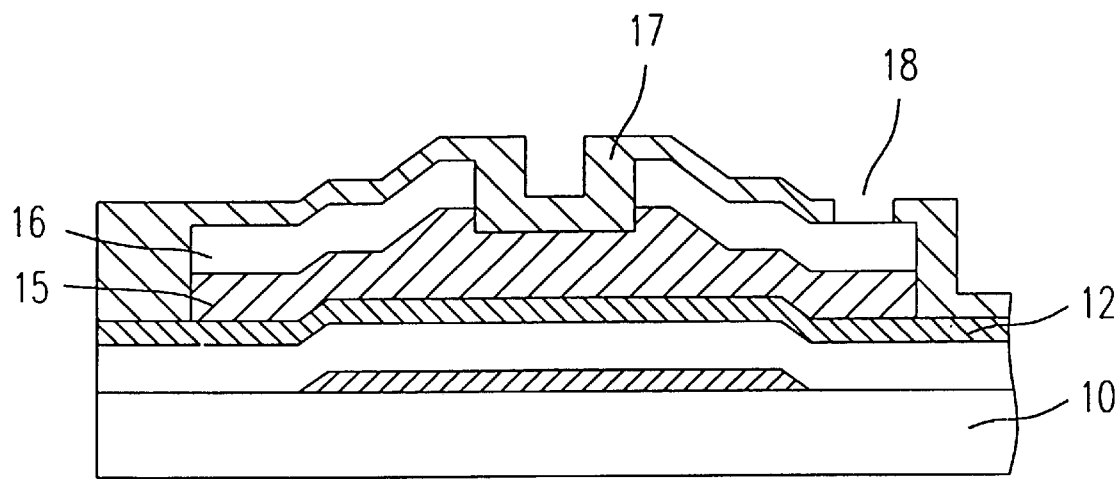
Figure 1E:
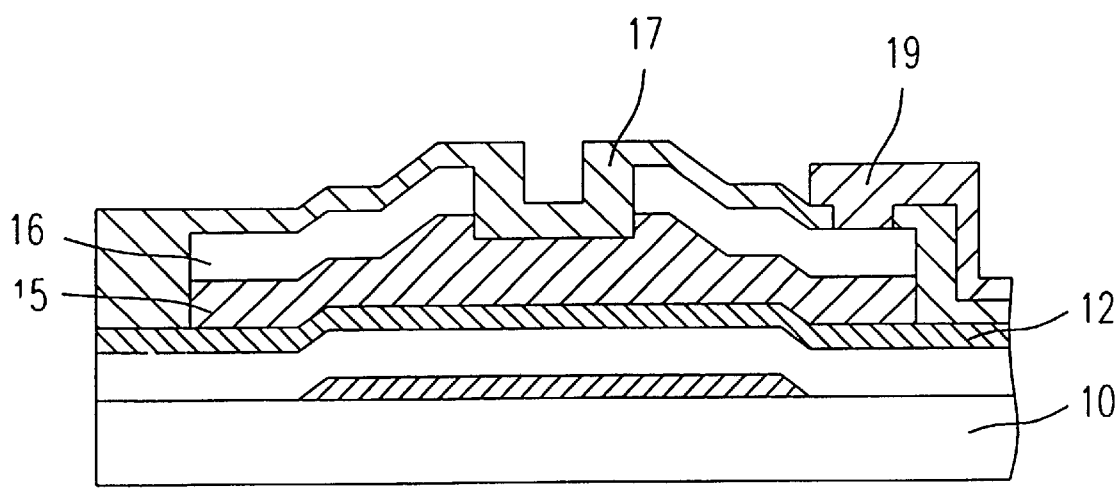
Figure 2A:
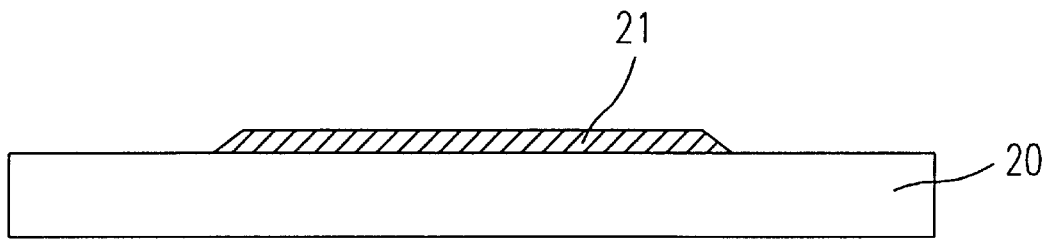
FIGS. 2(a) to (f) are schematic views showing a method for fabricating a TFT-LCD according to the preferred embodiment of the present invention.
Figure 2B:
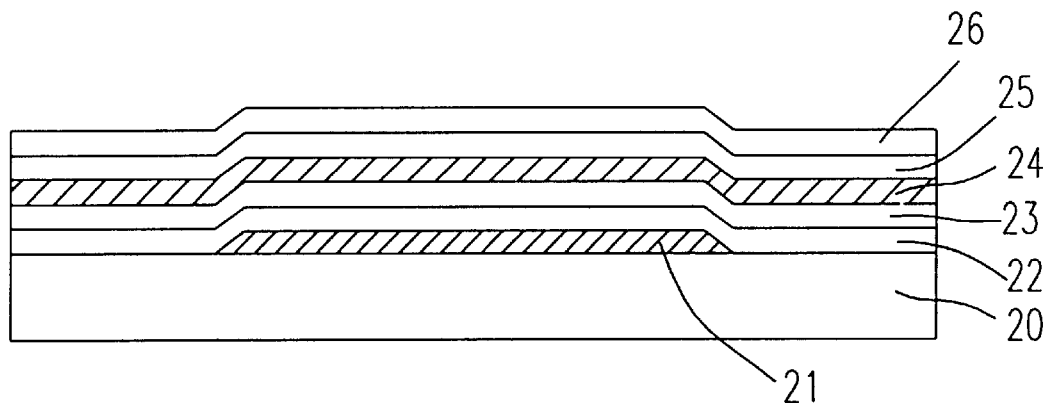
Figure 2C:
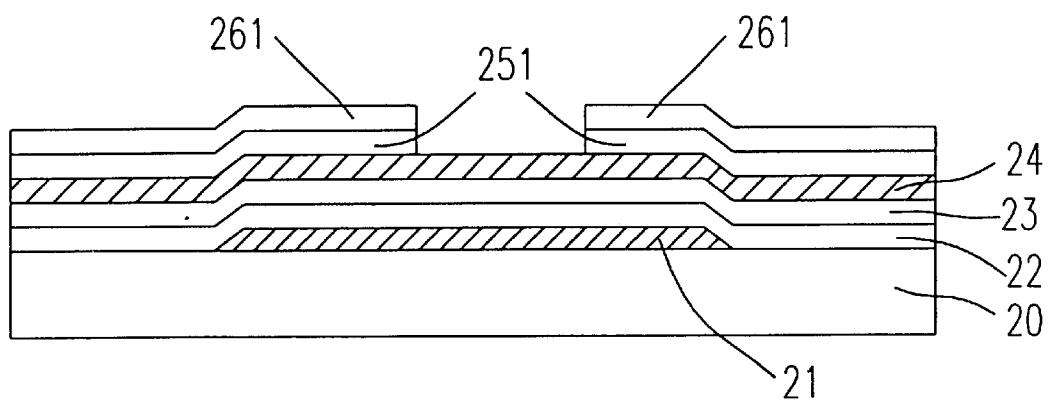

FIGS. 2(a) to (f) are schematic views showing a method for fabricating a TFT-LCD according to the preferred embodiment of the present invention. A gate conducting layer is formed on an insulation substrate 20, and subsequently a first photolithography and etch process is performed to form a gate conducting structure 21, as shown in FIG. 2(a). A gate insulation layer 22, a channel layer 23, a junction layer 24, a source/drain layer 25 and a data line layer 26 are formed in sequence, and a second photolithography and etch process is performed to form a data line structure 261 and a source/drain structure 251, as shown in FIG. 2(c).

Figure 2D:
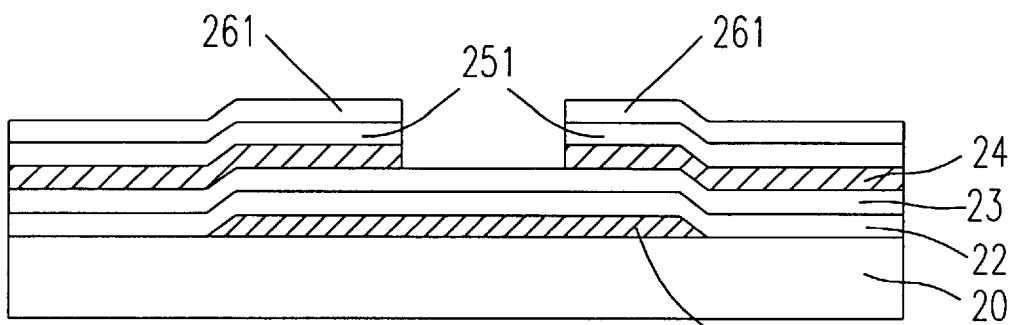
Figure 2E:
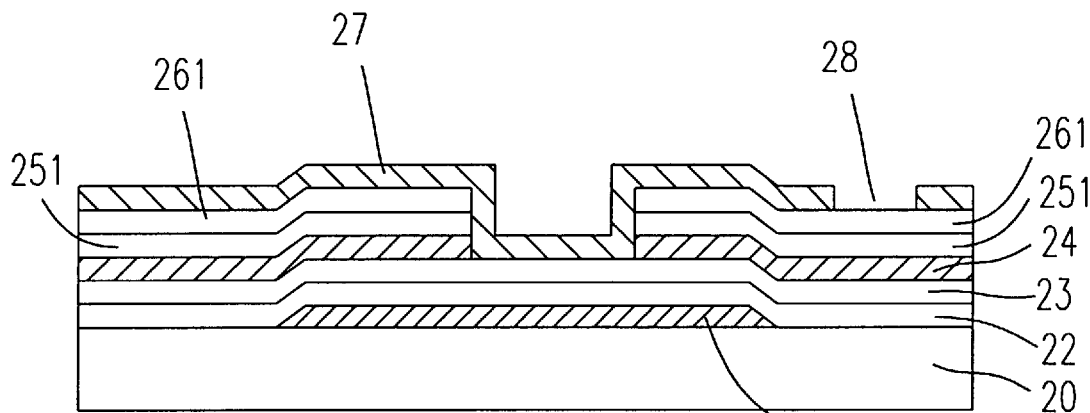

In addition, the channel layer 23 is made of intrinsic amorphous silicon, and the material of the junction layer 24 is a highly doped germanium layer or a highly doped silicon-germanium layer. The source/drain layer 25 is made of highly amorphous silicon. Then, according to a good selective etching ratio of the junction layer 24 to the source/drain layer 25 and also a good selective ratio of the junction layer 24 to the channel layer 23, further etch processes could be performed downward by using the data line structure 261 and the source/drain structure 251 as masks to remove the exposed portion of the junction layer 24, as shown in FIG. 2(d). A passivation 27 is formed and a third photolithography and etch process is performed to form a contact window structure 28, as shown in FIG. 2(e).

Figure 2F:
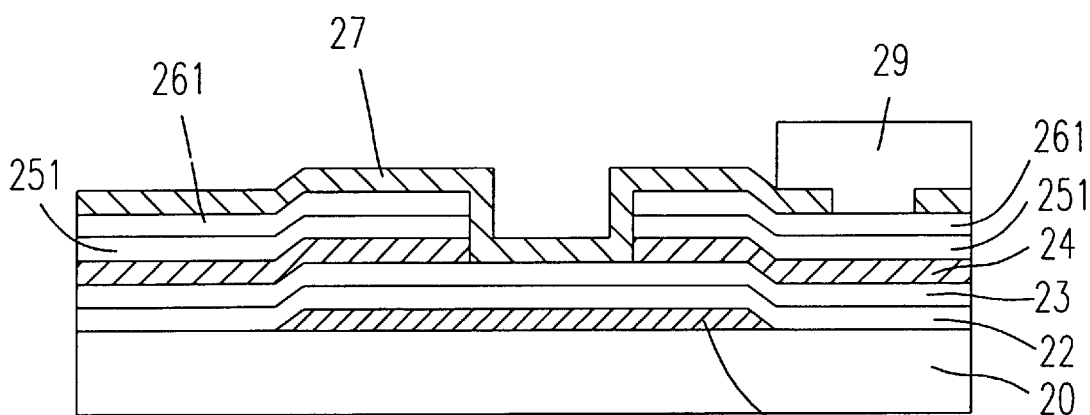

Subsequently, a transparent electrode layer made of indium tin oxide is formed and a fourth photolithography and etch process is performed to form a transparent pixel electrode region 29, as shown in FIG. 2(f). An annealing process is performed to improve electrical characteristics of the indium tin oxide.

According to the present invention, the insulation substrate 20 is made of a transparent glass. The gate conducting layer is made of a material selected from a group consisting of chromium, molybdenum, tantalum, tantalum molybdate, tungsten molybdate, aluminum, aluminum silicide, copper and the combination thereof The gate insulation layer 22 is made of a material selected from a group consisting of silicon nitrides ($SiN_x$), silicon oxide ($SiO_x$), tantalum oxide ($TaO_x$), aluminum oxide ($AlO_x$) and the combination thereof. The channel layer 23 is made of semiconductor such as an intrinsic microcrystalline silicon. The source/drain layer 25 is made of a highly doped semiconductor such as a highly doped microcrystalline silicon.

In addition, the data line layer 26 is made of an alloy of chromium/aluminum or molybdenum/aluminum/molybdenum. The passivation 27 is made of silicon nitride.

Certainly, if the transparent substrate is made of a heat-resisting material such as quartz, the foresaid semiconductor layers and highly doped semiconductor layers could be made of an amorphous silicon and highly doped polysilicon at a high temperature to get better electrical characteristics.

The material of the junction layer 24 is very important characteristic of the present invention. The junction layer 24 is a highly doped germanium layer. Moreover, the junction layer 24 could be made of a silicidable metal such as chromium, nickel, or platinum.

For reducing the resistance between the source/drain layer 25 and the channel layer 23, the junction layer 24 could be further treated with heat. The heat treatment could be combined with the annealing process performed on the transparent pixel electrode region 29. For example, the highly doped germanium layer or the highly doped silicon-germanium layer having a thickness ranged from about 100 to 200 angstrom is proceeded with the annealing process at 350 to 550° C. for 2 to 4 hours to form a Si—Ge alloy with silicon positioned nearby. Hence, resistance is reduced. In addition, if the junction layer is made of nickel and has a thickness ranged from about 50 to 100 angstrom, the junction layer is proceeded with the anneal process at 230° C. for 1 hour to form nickel silicide with silicon positioned nearby.

The method for fabricating the TFT-LCD according to the present invention needs four photolithography and etch processes. Accordingly, the method according to the present invention is simplified and cost is reduced. Moreover damage due to the photolithography and etch process is prevented, thereby improving reliability and yield of the fabricating process.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A method for fabricating a thin film transistor (TFT), comprising steps of:
   (a) providing an insulation substrate;
   (b) forming a conductive layer on said insulation substrate;
   (c) defining said conductive layer as a gate conducting structure by a first photolithography and etch process;
   (d) forming a gate insulation layer, a channel layer, a junction layer, a source/drain layer and a data line layer in sequence, and etching said data line layer, said source/drain layer and said junction layer by a second photolithography and etch process to form a source/drain structure and a data line structure, wherein said junction layer has relative good selective etching ratios to said data line layer and said source/drain layer respectively; and
   (e) heat-treating said junction layer to reduce resistance between said source/drain structure and said channel layer.

2. The method according to claim 1, wherein said channel layer is formed by intrinsic semiconductor, and said source/drain layer is made of highly doped semiconductor.

3. The method according to claim 2, wherein said intrinsic semiconductor is intrinsic amorphous silicon, and said highly doped semiconductor is highly doped amorphous silicon.

4. The method according to claim 3, wherein the material of said junction layer is one of a highly doped germanium layer and a highly doped silicon-germanium layer.

5. The method according to claim 4, wherein said junction layer has a thickness ranged from about 100 to 200 angstrom.

6. The method according to claim 5, wherein said step of heat-treating said junction layer is an annealing process performed at 350 to 550° C. for 2 to 4 hours.

7. The method according to claim 3, wherein said junction layer is a silicidable metal layer.

8. The method according to claim 7, wherein said silicidable metal is one selected from a group consisting of chromium, nickel and platinum.

9. The method according to claim 8, wherein said silicidable metal layer has a thickness ranged from about 50 to 100 angstrom.

10. The method according to claim 9, wherein said step of heat-treating said junction layer is an annealing process performed at 230° C. for 1 hour.

11. A method for fabricating a thin film transistor-liquid crystal display (TFT-LCD) via four photolithography and etch processes, comprising steps of:

(a) providing an insulation substrate;

(b) forming a conductive layer on said insulation substrate;

(c) defining said conductive layer as a gate conducting structure by a first photolithography and etch process;

(d) forming a gate insulation layer, a channel layer, a junction layer, a source/drain layer and a data line layer in sequence, and etching said data line layer, said source/drain layer and said junction layer by a second photolithography and etch process to form a source/drain structure and a data line structure, wherein said junction layer has relative good selective etching ratios to said data line layer and said source/drain layer respectively; and (e) forming a passivation and defining a contact window on said passivation by a third photolithography and etch process;

(f) forming a transparent electrode layer and defining a transparent pixel electrode region by a fourth photolithography and etch process; and (g) heat-treating said junction layer to reduce resistance between said source/drain structure and said channel layer.

12. The method according to claim 11, wherein said channel layer is formed by intrinsic semiconductor, and said source/drain layer is made of highly doped semiconductor.

13. The method according to claim 12, wherein said intrinsic semiconductor is intrinsic amorphous silicon, and said heavily doped semiconductor is highly doped amorphous silicon.

14. The method according to claim 13, wherein the material of said junction layer is one of a highly doped germanium layer and a highly doped silicon-germanium layer.

15. The method according to claim 14, wherein said junction layer has a thickness ranged from about 100 to 200 angstrom.

16. The method according to claim 15, wherein said step of heat-treating is a first annealing process performed at 230° C. for 1 hour.

17. The method according to claim 13, wherein said junction layer is a silicidable metal layer having a thickness ranged from about 50 to 100 angstrom.

18. The method according to claim 17, wherein said silicidable metal is one selected from a group consisting of chromium, nickel and platinum.

19. The method according to claim 18, wherein said transparent pixel electrode is made of indium tin oxide.

20. The method according to claim 19, wherein said first annealing process is combined with a second anneal process performed on said indium tin oxide.

* * * * *